(12) United States Patent
Sherlekar et al.

(10) Patent No.: US 8,612,914 B2
(45) Date of Patent: Dec. 17, 2013

(54) PIN ROUTING IN STANDARD CELLS

(75) Inventors: Deepak D. Sherlekar, Cupertino, CA (US); Vahe Hovsepyan, Yerevan (AM)

(73) Assignee: Synopsys, Inc., Mountain View, CA (US)

( * ) Notice: Subject to any disclaimer, the term of this patent is extended or adjusted under 35 U.S.C. 154(b) by 274 days.

(21) Appl. No.: 13/070,440

(22) Filed: Mar. 23, 2011

(65) Prior Publication Data
US 2012/0241986 A1  Sep. 27, 2012

(51) Int. Cl.
*G06F 17/50* (2006.01)

(52) U.S. Cl.
USPC ........... 716/119; 716/110; 716/111; 716/118; 716/126

(58) Field of Classification Search
USPC .......................... 716/110, 111, 118, 119, 126
See application file for complete search history.

(56) References Cited

U.S. PATENT DOCUMENTS

| | | | |
|---|---|---|---|
| 5,943,243 A | | 8/1999 | Sherlekar et al. |
| 6,091,090 A | | 7/2000 | Gheewala |
| 6,617,621 B1 | | 9/2003 | Gheewala et al. |
| 6,637,016 B1 * | | 10/2003 | Gasanov et al. ............. 716/119 |
| 6,838,713 B1 | | 1/2005 | Gheewala et al. |
| 6,865,721 B1 * | | 3/2005 | Dahl et al. .................... 716/124 |
| 7,039,881 B2 * | | 5/2006 | Regan ........................... 716/103 |
| 7,069,522 B1 | | 6/2006 | Sluss et al. |
| 7,129,562 B1 | | 10/2006 | Gheewala et al. |
| 7,219,324 B1 | | 5/2007 | Sherlekar et al. |
| 7,475,379 B2 * | | 1/2009 | McCullen .................... 716/126 |
| 7,603,634 B2 | | 10/2009 | Sluss et al. |
| 7,895,548 B2 | | 2/2011 | Lin et al. |
| 7,989,849 B2 | | 8/2011 | Sherlekar et al. |
| 2001/0034873 A1 | | 10/2001 | Arsintescu |
| 2003/0084418 A1 * | | 5/2003 | Regan ............................ 716/14 |
| 2005/0081176 A1 | | 4/2005 | Ohshige |
| 2006/0048079 A1 | | 3/2006 | Dirks et al. |
| 2006/0117283 A1 | | 6/2006 | Katou et al. |
| 2006/0198228 A1 | | 9/2006 | Sluss et al. |
| 2007/0157144 A1 | | 7/2007 | Mai et al. |
| 2007/0180419 A1 | | 8/2007 | Sherlekar et al. |
| 2008/0028352 A1 * | | 1/2008 | Birch et al. .................... 716/12 |
| 2008/0111158 A1 | | 5/2008 | Sherlekar et al. |
| 2009/0108360 A1 | | 4/2009 | Smayling et al. |
| 2009/0169832 A1 | | 7/2009 | Aton |
| 2009/0235210 A1 * | | 9/2009 | Shih et al. ......................... 716/2 |
| 2010/0097875 A1 | | 4/2010 | Vinke et al. |
| 2010/0155783 A1 | | 6/2010 | Law et al. |

(Continued)

OTHER PUBLICATIONS

PCT International Search Report and Written Opinion, PCT Application No. PCT/US12/26177, Jun. 29, 2012, 12 pages.

(Continued)

*Primary Examiner* — Jack Chiang
*Assistant Examiner* — Brian Ngo
(74) *Attorney, Agent, or Firm* — Fenwick & West LLP

(57) ABSTRACT

Cells designed to accommodate metal routing tracks having a pitch that is an odd multiple of a manufacturing grid. The cells includes cell pins that are located within the cell based on the offsets of the routing tracks relative to the cell boundaries. The cell pins are wider than wires that are routed along the metal routing tracks. The standard cell may be placed in a layout in either a normal orientation or in a flipped orientation. In both orientations, the cell pins are aligned with the wires that are routed along the metal routing tracks.

24 Claims, 9 Drawing Sheets

(56) References Cited

U.S. PATENT DOCUMENTS

2010/0181600 A1 7/2010 Law et al.
2011/0078639 A1 3/2011 Lin et al.
2012/0110539 A1* 5/2012 Birch et al. .................. 716/130
2012/0241986 A1 9/2012 Sherlekar et al.

OTHER PUBLICATIONS

PCT International Search Report and Written Opinion, PCT Application No. PCT/US12/30777, Jun. 22, 2012, 13 pages.

* cited by examiner

PIN ROUTING IN STANDARD CELLS

BACKGROUND

1. Field of Art

The disclosure generally relates to the field of electronic design automation (EDA), and more specifically to routing of pins for a standard cell that is used to design integrated circuits (ICs).

2. Description of the Related Art

Computer-aided cell-based design has been developed for quickly designing large scale ICs such as application specific integrated circuits (ASICs) and gate arrays. The cell is a circuit that has been pre-designed and pre-verified as a building block. Design technologies known as standard cell and gate array use different types of such building blocks. In a standard cell design, each distinct cell in a library may have unique geometries of active, gate, and metal levels. With gate arrays however, each cell shares the same building block, called a core cell that includes fixed active and gate level geometries. Different gate array cells are implemented using only metal interconnections between the active and gate elements of one or more core cells. Examples of a standard cell or gate array cell include an inverter, a NAND gate, a NOR gate, a flip flop, and other similar logic circuits.

During the process of designing an integrated circuit, a designer may select particular cells from a library of cells and use them in a design. The library includes cells that have been designed for a given IC manufacturing process, such as complementary metal oxide semiconductor (CMOS) fabrication. The cells generally have a fixed height but a variable width, which enables the cells to be placed in rows. Cells do not change from one design to the next, but the way in which they are interconnected will, to achieve the desired function in a given design. By being able to select the cells from the library for use in the design, the designer can quickly implement a desired functionality without having to custom design the entire integrated circuit from scratch. Thus, the designer will have a certain level of confidence that the integrated circuit will work as intended when manufactured without having to worry about the details of the individual transistors that make up each cell.

Cells are normally designed so that routing connections between cells can be made efficiently. Routing in an IC design is accomplished through routing elements, such as wires in one or more metal layers. Each metal layer is separated from other metal layers by insulating layers, and vias connect one metal layer to another. These routing elements perform at least two functions: they connect individual transistors that make up a standard cell, and they connect cells to each other globally (i.e., on a chip-level) to implement the desired functionality of the integrated circuit. For example, clock signals, reset signals, test signals, and supply voltages may be carried through these routing elements. A well designed standard cell layout minimizes congestion in routing global interconnections, which reduces the number of metal layers in or overall size of an integrated circuit layout.

SUMMARY

Embodiments of the present disclosure relate to an integrated circuit, a method for creating a layout for an integrated circuit, a computer-readable medium storing instructions for creating a layout for an integrated circuit, and a system for creating a layout for an integrated circuit. In one embodiment, the integrated circuit has a first metal wire extending along a first routing track and a second metal wire extending along a second routing track. Both routing tracks are parallel to an axis and are separated by one or more routing pitches. The integrated circuit also includes a first instance of a cell that includes a first cell pin. The first cell pin is wider than the first metal wire and connects to the first metal wire. The integrated circuit also includes a second instance of the cell that is flipped about the axis. The second cell instance includes a pin that corresponds to the first pin and is connected to the second metal wire. In one embodiment, the first and second metal wires are of a minimum metal width, and the cell pins are wider than the minimum metal width.

One embodiment of the method comprises receiving a cell library including a plurality of cells and generating a layout for an integrated circuit by arranging instances of the cells. The layout has a first metal wire extending along a first routing track and a second metal wire extending along a second routing track. Both routing tracks are parallel to an axis and are separated by one or more routing pitches. The integrated circuit also includes a first instance of a cell that includes a first cell pin. The first cell pin is wider than and connects to the first metal wire. The integrated circuit also includes a second instance of the cell that is flipped about the axis. The second cell instance includes a pin that corresponds to the first pin and is connected to the second metal wire. One embodiment of the computer-readable medium stores instructions for performing the method. One embodiment of the system includes a processor for executing the instructions stored on the computer readable medium.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
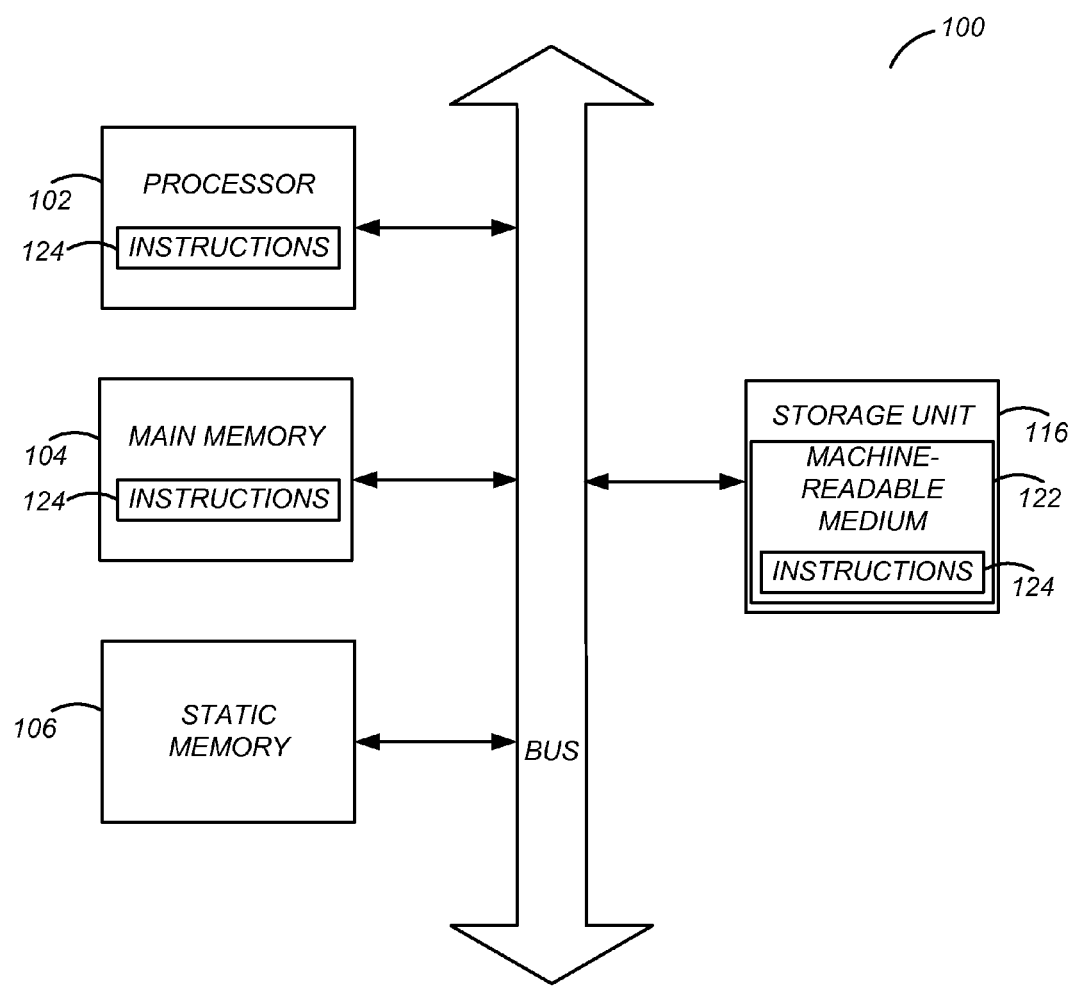
FIG. 1 illustrates one embodiment of components of an example machine able to read instructions from a machine-readable medium and execute them in a processor (or controller).

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. Alternative embodiments of the structures and methods illustrated herein may be employed without departing from the principles described herein.

Embodiments of the present disclosure relate to standard cells designed to accommodate routing tracks having a pitch that is an odd multiple of a manufacturing grid. The standard cell includes cell pins that are offset from the edges of the cell based on the locations of the routing tracks relative to the cell boundaries. The cell pins are wider than minimum metal width wires routed along the routing tracks. By configuring the pins of a standard cell in this manner, the standard cell can be arranged in a layout in its normal orientation, or flipped about its axis. In both orientations, the cell pins still maintain proper alignment with minimum width wires placed along the routing tracks.

A cell described herein refers to predefined circuit unit or circuit element that is provided, as part of a cell library of many different types of circuit units, to an integrated circuit designer; the cell is re-used in multiple instances as needed to make up the integrated circuit. For example, a cell may be an inverter, a NAND gate, a NOR gate, a flip flop, and other similar logic circuits. Each cell has a boundary, typically consisting of four edges that form a rectangular shape. As used herein, a standard cell refers to a cell with a predefined layout that is used in conjunction with other standard cells to implement a desired functionality of an integrated circuit. Standard cells may have fixed active and gate level geometries. Standard cells have a fixed height but variable width, which allows the standard cells to be placed side by side in rows. Embodiments of this disclosure will be described with reference to standard cells, but the principles described herein are applicable to both standard cells and other cells such as gate array cells.

A cell pin described herein refers to metal wires within a cell that serve as connection points for external connections to a cell (e.g., connections between one cell and another cell). Cell pins are sometimes referred to as cell ports, although the term cell pin is meant to include both cell pins and cell ports. Cell pins may be input pins, which are the connection points for the input signals of a standard cell. Cell pins may be output pins, which are connection points for the output signals of a standard cell. The locations of the pins are designated by the designer of the standard cell when creating the cell.

As used herein, a minimum metal width is a parameter that is specified by the design rules for a particular manufacturing process. The wires in a design should not be narrower than the minimum metal width, but they may be wider than the minimum metal width. As used herein, a manufacturing grid refers to the grid that objects in an integrated circuit layout are aligned to. The manufacturing grid defines the finest granularity that can be created during the manufacturing process. As used herein, a routing track refers to reference lines that define the preferred center of metal wires within a given metal layer. When generating a layout, metal wires are placed along the routing tracks to make chip-level connections between standard cells to implement a desired functionality of an integrated circuit.

Computing Machine Architecture

FIG. 1 is a block diagram illustrating components of an example machine able to read instructions from a machine-readable medium and execute them in a processor (or controller). Specifically, FIG. 1 shows a diagrammatic representation of a machine in the example form of a computer system 100 within which instructions 124 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), or any machine capable of executing instructions 124 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein.

The example computer system 100 includes a processor 102 (e.g., a central processing unit (CPU), a graphics processing unit (GPU), a digital signal processor (DSP), one or more application specific integrated circuits (ASICs), a main memory 104, a static memory 106, and a storage unit 116 which are configured to communicate with each other via a bus 108. The storage unit 116 includes a machine-readable medium 122 on which is stored instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting machine-readable media.

While machine-readable medium 122 is shown in an example embodiment to be a single medium, the term "machine-readable medium" should be taken to include a single medium or multiple media (e.g., a centralized or distributed database, or associated caches and servers) able to store instructions (e.g., instructions 124). The term "machine-readable medium" shall also be taken to include any medium that is capable of storing instructions (e.g., instructions 124) for execution by the machine and that cause the machine to perform any one or more of the methodologies disclosed herein. The term "machine-readable medium" includes, but not be limited to, data repositories in the form of solid-state memories, optical media, and magnetic media.

Overview of EDA Design Flow

Figure 2:
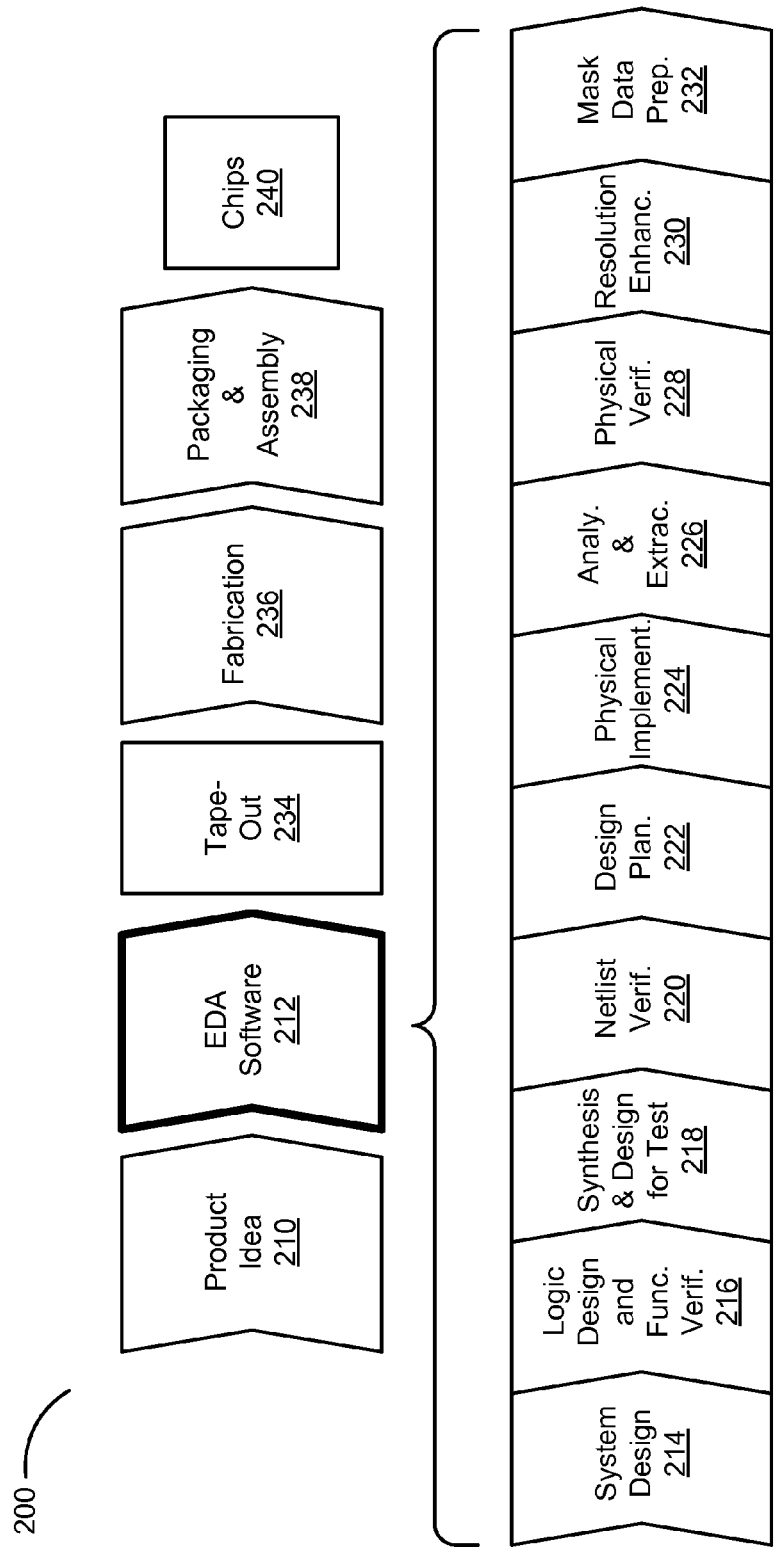
FIG. 2 is one embodiment of a flowchart illustrating various operations in the design and fabrication of an integrated circuit.

FIG. 2 is a flowchart 200 illustrating the various operations in the design and fabrication of an integrated circuit. This process starts with the generation of a product idea 210, which is realized during a design process that uses electronic design automation (EDA) software 212. When the design is finalized, it can be taped-out 234. After tape-out, a semiconductor die is fabricated 236 to form the various objects (e.g., gates, metal layers, vias) in the integrated circuit design. Packaging and assembly processes 238 are performed, which result in finished chips 240.

The EDA software 212 may be implemented in one or more computing devices such as the computer 100 of FIG. 1. For example, the EDA software 212 is stored as instructions in the computer-readable medium which are executed by a processor for performing operations 214-232 of the design flow, which are described below. This design flow description is for illustration purposes. In particular, this description is not meant to limit the present disclosure. For example, an actual integrated circuit design may require a designer to perform the design operations in a difference sequence than the sequence described herein.

During system design 214, designers describe the functionality to implement. They can also perform what-if planning to refine the functionality and to check costs. Note that hardware-software architecture partitioning can occur at this stage. Example EDA software products from Synopsys, Inc. of Mountain View, Calif. that can be used at this stage include: Model Architect®, Saber®, System Studio®, and Designware® products.

During logic design and functional verification 216, VHDL or Verilog code for modules in the circuit is written and the design is checked for functional accuracy. More specifically, the design is checked to ensure that it produces the correct outputs. Example EDA software products from Synopsys, Inc. of Mountain View, Calif. that can be used at this stage include: VCS®, Vera®, 10 Designware®, Magellan®, Formality®, ESP® and Leda® products.

During synthesis and design for test 218, VHDL/Verilog is translated to a netlist. This netlist can be optimized for the target technology. Additionally, tests can be designed and implemented to check the finished chips. Example EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

During netlist verification 220, the netlist is checked for compliance with timing constraints and for correspondence with the VHDL/Verilog source code. Example EDA software products from Synopsys, Inc. of Mountain View, Calif. that can be used at this stage include: Formality®, Primetime®, and VCS® products.

During design planning 222, an overall floor plan for the chip is constructed and analyzed for timing and top-level routing. Example EDA software products from Synopsys, Inc. of Mountain View, Calif. that can be used at this stage include: Astro® and IC Compiler® products.

During physical implementation 224, the placement (positioning of circuit elements) and routing (connection of the same) occurs. Example EDA software products from Synopsys, Inc. of Mountain View, Calif. that can be used at this stage include: the Astro® and IC Compiler® products.

During analysis and extraction 226, the circuit function is verified at a transistor level, which permits refinement. Example EDA software products from Synopsys, Inc. of Mountain View, Calif. that can be used at this stage include: Astrorail®, Primerail®, Primetime®, and Star RC/XT® products.

During physical verification 228, the design is checked to ensure correctness for: manufacturing, electrical issues, lithographic issues, and circuitry. Example EDA software products from Synopsys, Inc. of Mountain View, Calif. that can be used at this stage include the Hercules® product.

During resolution enhancement 230, geometric manipulations of the layout are performed to improve manufacturability of the design. Example EDA software products from Synopsys, Inc. of Mountain View, Calif. that can be used at this stage include: Proteus®, Proteus®AF, and PSMGED® products.

During mask-data preparation 232, the 'tape-out' data for production of masks to produce finished chips is provided. Example EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software 212 that includes operations between design 214 and resolution enhancement 230.

Pin Layout in a Standard Cell

Figure 9:
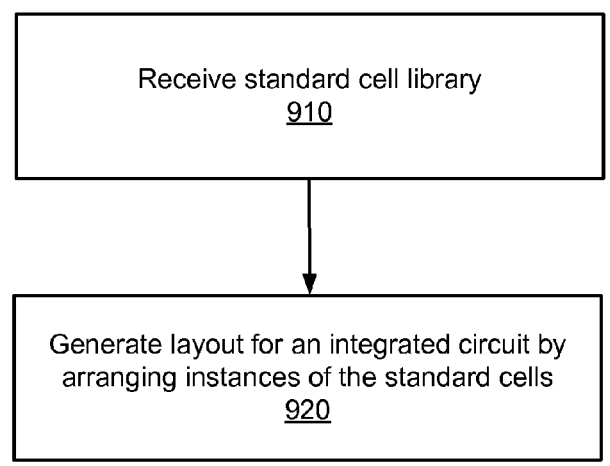
FIG. 9 illustrates one embodiment of a method for generating a layout for an integrated circuit.

FIG. 9 is one embodiment of a method for generating a layout for an integrated circuit. The method is performed, for example, by the EDA software 212 during design planning 222 or physical implementation 224. In one embodiment, the EDA software 212 receives 910 a standard cell library. For example, the standard cell library is stored in a computer readable medium of computer 100 and loaded into memory by the EDA software 212, or the standard cell library may be retrieved from another computer 100 over a network. The standard cell library includes a set of standard cells that are designed for a particular manufacturing process. The standard cells may be of a fixed height but variable width, which enables the standard cells to be placed side by side in rows. The EDA software 212 then generates 920 a layout for an integrated circuit by arranging instances of the standards cells from the standard cell library. A standard cell instance refers to data representing a cell in the context of a circuit layout. A standard cell instance also refers to a physical representation of a standard cell when used in the context of a fabricated circuit. The EDA software 212 also connects the standard cell instances together to implement a desired functionality of an integrated circuit.

Figure 3:
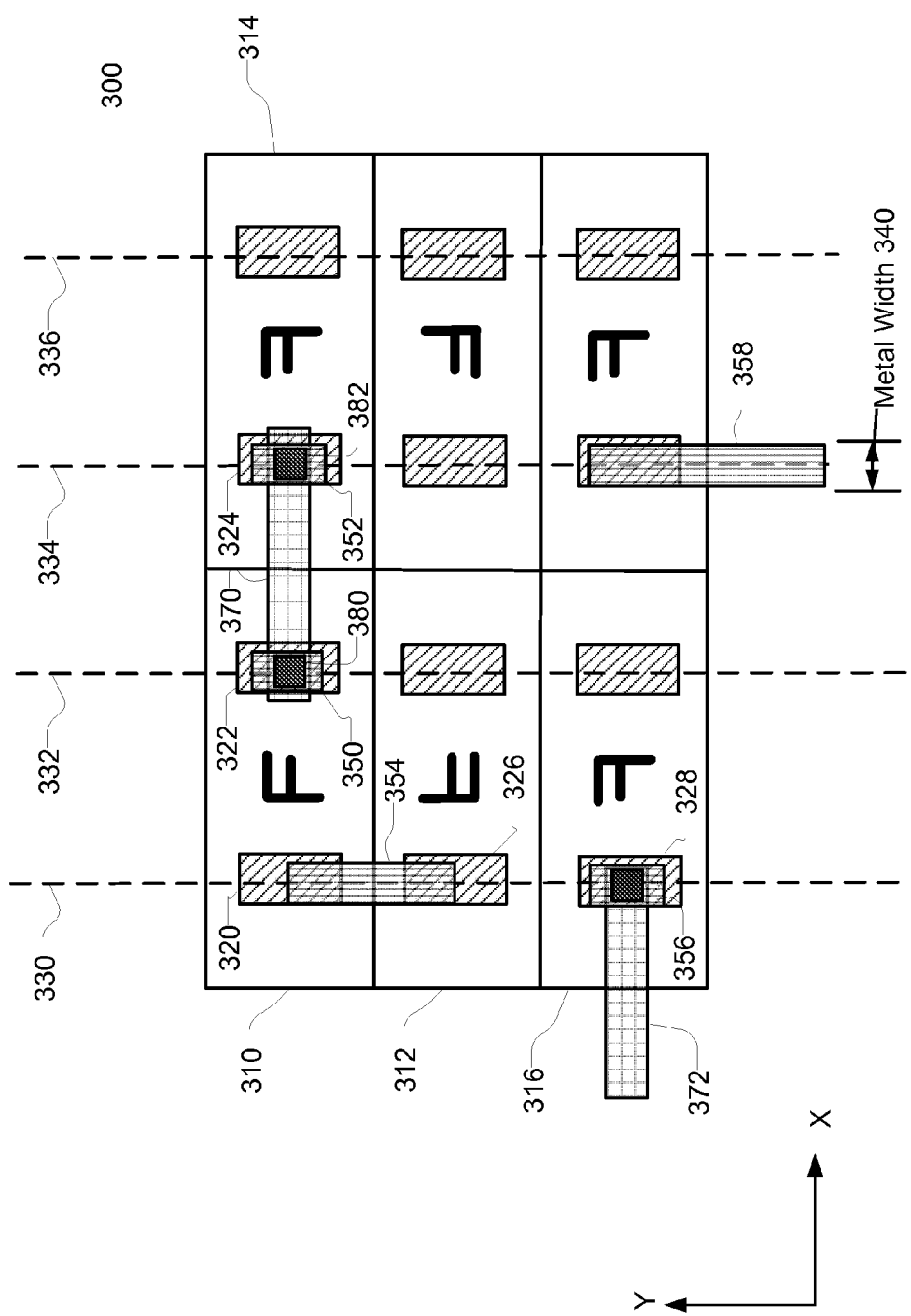
FIG. 3 illustrates one embodiment of an integrated circuit layout generated from standard cells.

FIG. 3 illustrates one embodiment of an integrated circuit layout 300 generated from standard cells with improved pin layouts. As shown, the layout includes six instances of a standard cell, such as standard cell instances 310, 312, 314 and 316, organized into a 2×3 matrix. The integrated circuit has three rows, and each row includes two standard cells instances. The standard cell instances are meant to represent any generic standard cell (i.e., Inverter, NAND, NOR, flops, etc), although all the details of these cells is not shown in these figures, and the layout may contain a mix of different types of standard cells. In FIG. 3, standard cell 310, 312, 314 and 316 are all instances of the same standard cell (e.g., an inverter). Instance 310 is the standard cell placed in its normal orientation. The other cell instances (e.g., 312, 314 and 316) represent the same standard cell that is flipped about the X and/or Y axis. Standard cells may be flipped or rotated in any direction while retaining their intended functionality. This provides the EDA software 212 with greater flexibility in placing cells and routing connections between standard cells.

The standard cell instances in the integrated circuit have cell pins, such as cell pin 320 and 322. As explained previously, the cell pins are the access points for the input and output signals of the standard cell instance. For example, if a standard cell instance represents an inverter, cell pin 320 is the input to the inverter and cell pin 322 is the output of the inverter. Standard cell instances implementing other logic functions (e.g., NAND, NOR, flops) may have a greater number of cell pins. Cell pins are often routed on a lower metal layer, such as a metal one (M1) layer or a metal two (M2) layer. In the embodiment of FIG. 3, the cell pins are placed in the M1 layer and are configured to be wider than a minimum metal width specified by design rules. As described explained in greater detail in conjunction with FIGS. 6 through 8, the use of wider cell pins allows the pins to be connected to on-track wires (i.e., wires placed along routing tracks), even if the standard cells are flipped about their Y-axis.

Routing tracks 330, 332, 334, and 336 are reference lines that define the preferred center of chip-level (i.e., cell to cell) routes created by the EDA software 212 during physical implementation 224. The routes can be, for example, wires and vias that connect the cell pins to each other. Routing along tracks allows for faster chip-level routing by the EDA software 212. Although it is possible for EDA software 212 to route off the tracks, this requires more execution time and memory. Thus, routing is more efficient when the cell pins are aligned with the routing tracks to avoid routing off track. Routing along tracks also creates regularity in the wire routing, which decreases routing congestion at the chip-level. Routing tracks may run vertically for vertical wires (e.g., 330 and 332) or horizontally for horizontal wires (not shown), resulting in a coarse grid of routing tracks. In one embodiment, routing tracks within a metal layer have a fixed pitch (i.e., distance between routing tracks is fixed).

In FIG. 3, the routing tracks (e.g., 330 and 332) represent the routing tracks for the M1 layer. Integrated circuits layouts have multiple metal layers for routing signals. The layer closest to the substrate is referred to as the metal 1 ("M1") layer. Other metal layers, such as the metal 2 ("M2") and metal 3 ("M3") layers are further from the substrate. In one embodiment, metal layers are routed according to an alternating horizontal-vertical-horizontal (HVH) or vertical-horizontal-vertical (VHV) topology. In other words, all wires (and routing tracks) in a metal layer run predominantly in one direction, and the wires in the adjacent metal layer run predominantly in an orthogonal direction. For example, in the VHV routing topology, the wires in the M1 layer run vertically, the wires in the M2 layer run horizontally, and the wires in the M3 layer run vertically. In another embodiment, metal layers are routed following HHV topology. In this topology, M1 and M2 are predominantly horizontal, M3 is predominantly vertical, and routing directions in subsequent layers alternate with M4 horizontal, M5 vertical, and so on. The routing tracks in similarly oriented layers may or may not be the same. For example, in one embodiment, the vertical routing tracks (e.g., 330 and 332) also represent the routing tracks for not only the M1 layer, but also for the M3 layer.

The cell pins (e.g., 322 and 324) of the standard cell instances are connected together to implement a desired functionality of an integrated circuit. For example, cell pin 322 is coupled to cell pin 324 through metal wire 350, via 380, metal wire 370, via 382, and metal wire 352. Metal wires 350 and 352 are metal wire stubs routed in the M1 layer to connect to the cell pins 322 and 324. Metal wire 370 is routed horizontally in the M2 layer. Vias 380 and 382 connect together the metal wires of the different M1 and M2 layers. As another example, cell pin 320 is coupled to cell pin 326 with a wire 354 in the M1 layer. In other embodiments wire 354 can be replaced with a wire in the M3 layer that connects to the cell pins 320 and 326 through vias and wire stubs in the M1 layer. Additionally, wires 358 and 372 represent connections to other cells that are not shown in FIG. 3. Wire 372 is routed in the M2 layer and is connected to a cell pin 328 through a via and a metal wire 356 in the M1 layer.

The wires in the M1 layer (e.g., wires 350, 352, 354, 356, 358) are centered along their respective routing tracks (e.g., tracks 330, 332, 334, 336). The width of the M1 metal wires (e.g., wire 350) is equal to a minimum metal width that is specified by design rules. As described in greater detail in conjunction with FIGS. 6-8, because the cell pins have a width that is greater than the minimum metal width, the EDA software can advantageously connect the cell pins to on-track wires regardless of whether a standard cell is placed in a normal orientation or if the standard cell is flipped on its Y axis. In both orientations the cell pins are aligned (i.e., fully enclose along the X-axis) the wires that the cell pins are connected to.

An integrated circuit layout 300 must also comply with design rules. Design rules restrict the placement of objects in a layout to account for inevitable variations during the manufacturing process. There are three basic types of objects in any physical design: line objects (e.g., gates, metals), point objects (e.g., contacts, vias) and block objects (e.g., diffusions, implants). Modern layout designs are subject to many design rules that limit both the size of the objects and their proximity to other objects.

Referring still to FIG. 3, one design rule known as the "minimum metal width rule" specifies a minimum width 340 for each metal wire in a circuit design ("minimum metal width"). For example, for certain manufacturing processes, the minimum metal width rule specifies a minimum metal width 340 of 50 nm. The minimum metal width rule only sets a lower bound on the size of a metal wire, so metal wires may be wider than the minimum metal width. However, to improve routing density, most metal wires in an integrated circuit layout are configured to be as narrow as possible without violating the minimum metal width rule. It is also preferable to route chip-level connections between cells with narrower wires because narrower wires have a lower load, which results in smaller signaling delays and faster circuits.

Figure 4:
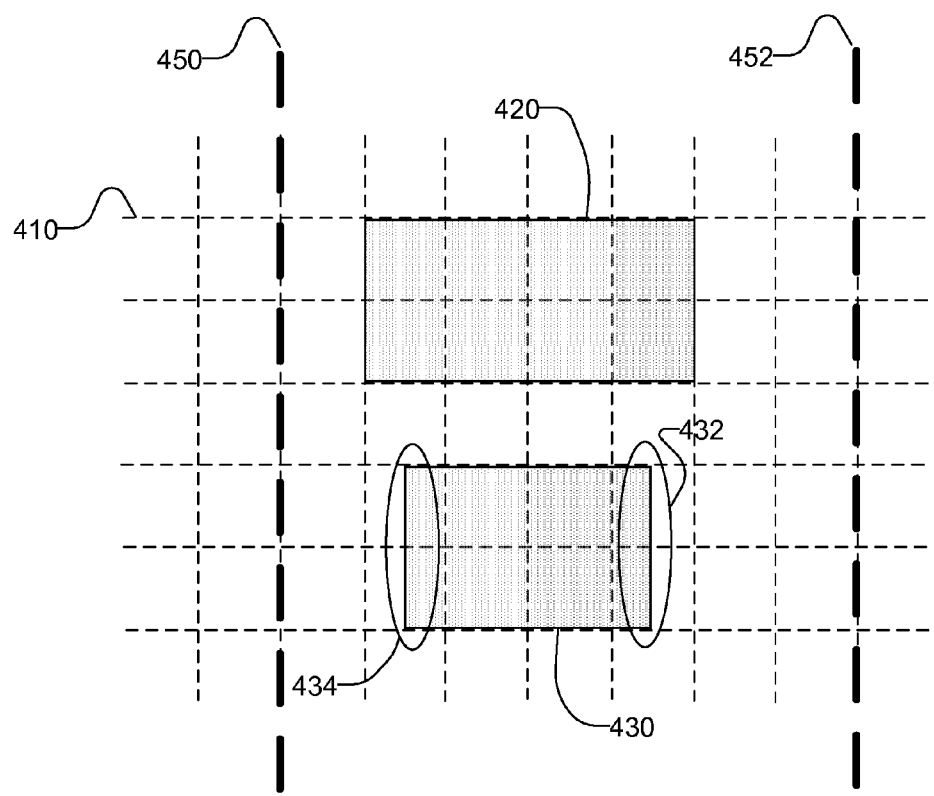
FIG. 4 illustrates one embodiment of the manufacturing grid rule.

FIG. 4 illustrates one embodiment of the "manufacturing grid rule". Modern layout designs are gridded designs. In a gridded design, a design rule known as the manufacturing grid rule requires that the edges of all objects be aligned to a pre-determined grid known as a manufacturing grid 410. The manufacturing grid 410 defines the finest granularity of any feature that can be created during the manufacturing process. As shown in FIG. 4, object 420 satisfies the manufacturing grid rule because all sides of object 420 are aligned to the manufacturing grid 410. Object 430 does not satisfy the manufacturing grid rule. Although the top and bottom of object 430 are aligned to the manufacturing grid 410, the right 432 and left 434 sides of object 430 are not aligned to the manufacturing grid 410.

Additionally, the routing tracks 450 and 452 for the metal wires and the corners of each standard cell instance are placed on the manufacturing grid. In one embodiment, the routing tracks have a pitch (i.e. spacing between successive tracks) that is equal to an odd multiple of the manufacturing grid. For example, routing track 450 and routing track 452 are separated by seven units of the manufacturing grid, which is an odd multiple of the manufacturing grid.

Another design rule is known as the "gate pitch rule." In integrated circuit layouts, all transistor gates run in a single direction. In one embodiment, the gates are comprised of a material such as polycrystalline silicon or metal. The gate pitch rule requires all gates to have a fixed pitch. The gate pitch is equal to the space between adjacent gates plus the width of the gate itself. In other words, the gate pitch is a measure of the center to center distance between adjacent gates. The gate pitch must be a multiple of the manufacturing grid. In one embodiment, for standard cell designs, the gates are vertically oriented and the width of a standard cell is a multiple of the gate pitch. Cell widths that are a multiple of the gate pitch enable standard cells to be placed side by side in a row without any space between the cells. In other embodiments, the cell width may not be a multiple of the gate pitch, but may instead be a multiple of the pitch between metal routing tracks.

Figure 5:
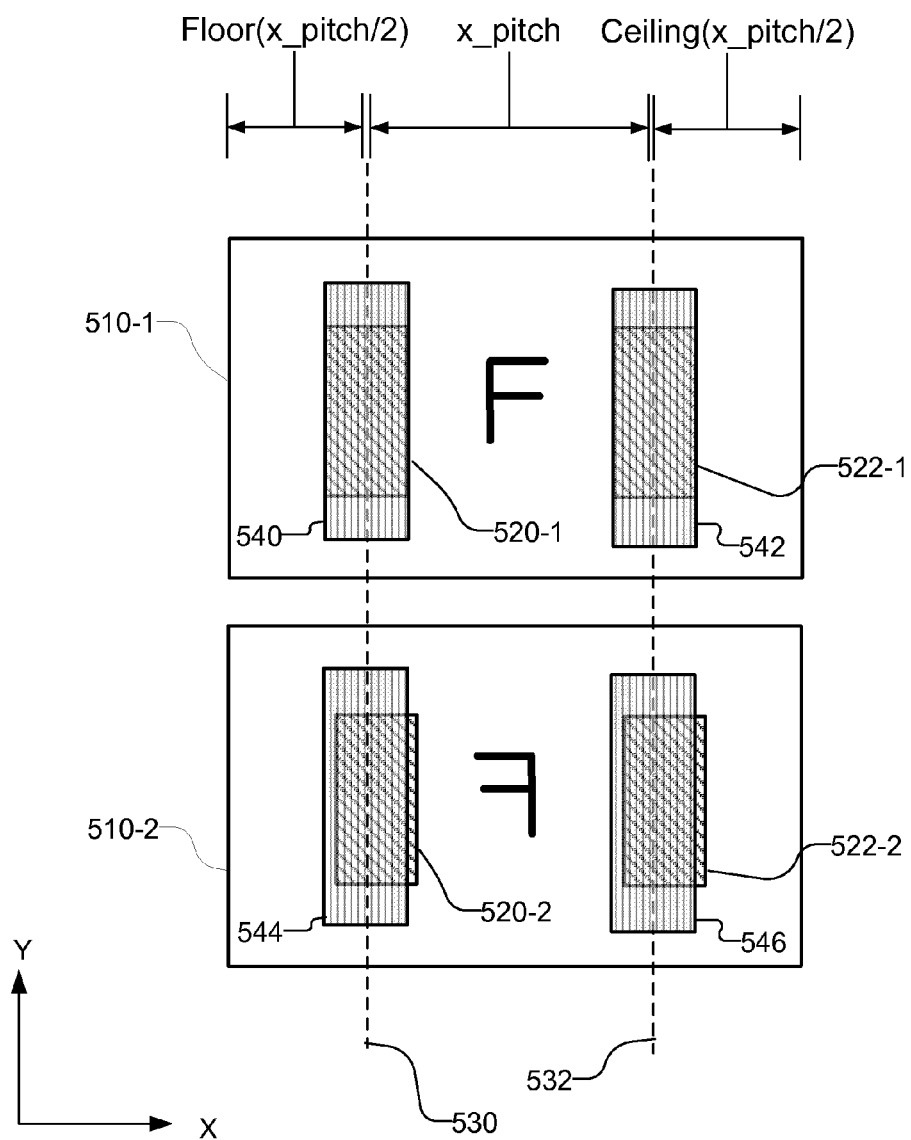
FIG. 5 illustrates one embodiment of a standard cell layout with minimum width cell pins that includes two instances of a standard cell. The cell pins are highlighted with diagonal fill and wires on the vertical routing tracks are highlighted with vertical fill.

FIG. 5 is a standard cell layout with minimum metal width pins and illustrates the problem that is addressed by the disclosed embodiments. As shown, the layout includes two standard cell instances 510-1 and 510-2 placed in different rows. The standard cell instances may be separated by one or more rows of cells (not shown). Standard cell instance 510-1 includes two cell pins 520-1 and 522-1 that are routed on the M1 layer and highlighted with diagonal fill. Standard cell instance 505-2 is identical to standard cell instance 505-1, but is flipped on its Y-axis. For purposes of illustration, various parts of the standard cells, such as gate layers, substrate layers, power rails, and other routing in the M1 layer have been omitted from the figure.

FIG. 5 also shows two routing tracks 530 and 532 that are used as reference points by the EDA software 212 when routing metal connections between cells. The distance between routing track 530 and routing track 532 is represented by x_pitch, where x_pitch is an odd multiple of the manufacturing grid. For example, if the manufacturing grid is 5 nm and the x_pitch is 135 nm, the x_pitch is equivalent to 27 manufacturing grid units. As shown, the width of the standard cell instance 505-1 is two times the x_pitch. In one embodiment, the x_pitch may or may not be the same as the gate pitch.

The routing tracks 530 and 532 are approximately half the x_pitch from the edges of the standard cell instance. Layouts created from standard cells are often more efficient when the cells are designed to accommodate routing tracks 530 and 532 that are located half the x_pitch from the edges of the cell. For example, cells designed to accommodate routing tracks offset by half the x_pitch can be placed side by side in a row without any space between the cells. However, when x_pitch is an odd multiple of the manufacturing grid, half of the x_pitch is not a multiple of the manufacturing grid. For example if x_pitch is 27 units, half the x_pitch is 13.5 units. As previously explained, the routing tracks are aligned with a multiple of the manufacturing grid, and 13.5 units is not a multiple of the manufacturing grid. Thus, the routing tracks are located at approximately, but not exactly, half the x_pitch from the cell boundaries. Routing track 530 is located at floor(x_pitch/2) from the left edge of the standard cell instance 510-1, where the x_pitch is expressed as a multiple of the manufacturing grid. The floor function rounds down to the closest multiple of the manufacturing grid. Routing track 532 is located at ceiling(x_pitch/2) from the right edge of the standard cell instance 510-1. The ceiling function rounds up to the closest multiple of the manufacturing grid. For example, if x_pitch/2 is 13.5 units, the floor is 13 units and the ceiling is 14 units.

Metal wires 540, 542, 544, and 546 are shown with horizontal fill and are routed in the M1 layer with their centers on the routing tracks above the cell pins. The metal wires (e.g., 540 and 542) each have a width that is equal to the minimum metal width. Cell pins 520-1 and 522-1 are offset from the edges of the cell 510-1 to align the pins with wires 540 and 542. Cell pin 520-1 is centered on routing track 530 and cell pin 522-1 is centered on routing track 532. The cell pins 520-1 and 522-1 each have a width that is equal to the minimum metal width. Each cell pin extends half of the minimum metal width to the left of a routing track and half of the minimum metal width to the right of a routing track.

When the standard cell instance 510-1 is placed in its normal orientation, the cell pins 520-1 and 522-1 are aligned with the metal wires 540 and 542. However, standard cell instance 510-1 has an asymmetric pin layout. Pin 520-1 is closer to the left edge of the cell than pin 522-1 is to the right edge of the cell. In other words, both cell pins 520-2 and 522-2 appear to be shifted toward the left of the cell 510-1 by one manufacturing grid. Thus, when cell 510-1 is flipped on its Y axis, the cell pins 520-2 and 522-2 in the flipped cell 510-2 are not aligned with minimum width wires 544 and 546 that are placed along routing tracks 530 and 532. In order to ensure a proper via connection to the cell pins, the EDA software 212 must align metal wires 540 and 542 with the cell pins 520-2 and 522-2 by routing the metal wires 544 and 546 off the routing track. Routing off track, however, is disfavored because it increases routing congestion at the chip level and increases the amount of time needed by the EDA software to route a design.

Figure 6:
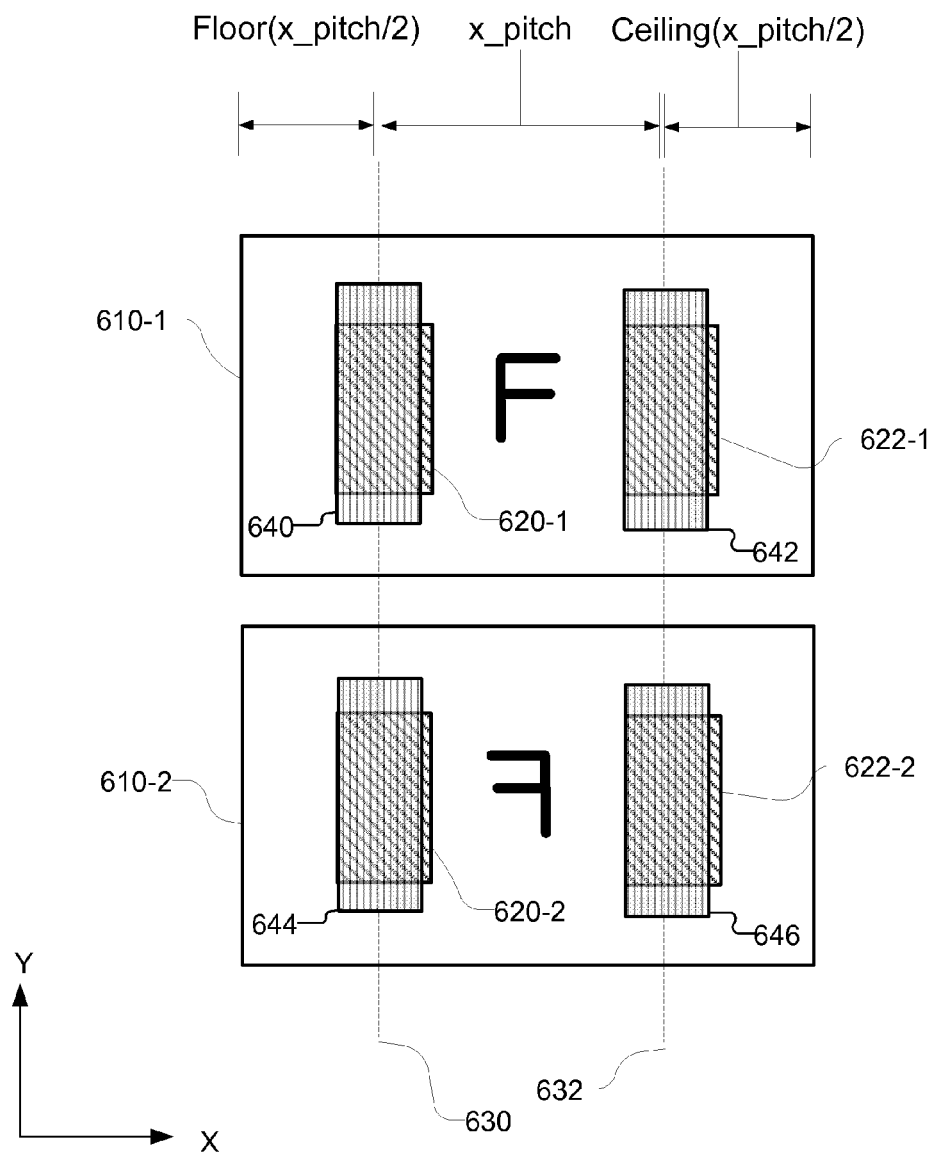
FIG. 6 illustrates one embodiment of an improved pin layout for standard cells with wider cell pins that includes two instances of a standard cell.

FIG. 6 illustrates one embodiment of an improved pin layout for standard cells. The standard cell instances in FIG. 6 have cell pins that are wider than the minimum metal width. A standard cell with wider pins advantageously allows for cell pins to line up with minimum width metal wires in vertical routing tracks, even when the cell is flipped along its Y-axis. In other words, FIG. 5 illustrates the problem, which is that minimum width pins are not aligned with minimum width wires placed along the routing tracks when the cell is flipped about its Y axis. FIG. 6 illustrates the solution, which is to extend the width of the pins to prevent the cell pins from shifting relative to the routing tracks when the cell is flipped about its Y axis.

As shown, the layout includes two standard cell instances 610-1 and 610-2 in different rows. The standard cell instances may be separated by one or more rows of cells (not shown). Standard cell instance 610-1 is meant to represent any generic standard cell (i.e., NAND, NOR, flops, etc), although all the details of these cells is not shown in these figures. Standard cell instance 610-1 is identical to standard cell instance 610-2, but is flipped on its Y-axis. For purposes of illustration, various components of the standard cell 610-1, such as gate layers, substrate layers, and various internal cell signals in the M1 and M2 layers have been omitted from FIG. 6.

The distance between routing track 630 and routing track 632 is x_pitch, where x_pitch is an odd multiple of the manufacturing grid. Routing track 630 is floor (x_pitch/2) from the left boundary of the standard cell instance 610-1. Routing track 630 is ceiling(x_pitch/2) from the right boundary of the standard cell instance 610-1. Minimum width wires 640 and 644 are routed along routing track 630. Minimum width wires 642 and 646 are routed along routing track 632. The width of standard cell 610-1 is two times the x_pitch. In other embodiments, the width of the standard cell 610-1 is more than two times the x_pitch and there are more than two routing tracks crossing the cell.

The cell pins 620-1 and 622-1 in the standard cell instance 610-1 are wider than the minimum width wires 640 and 642 routed on the M1 layer. Thus, when the cell is flipped on its Y-axis, the pins 620-2 and 622-2 in the flipped cell 610-2 are wide enough to align with minimum width wires 644 and 646 in the M1 layer that are centered along vertical routing tracks 630 and 632. In other words, the cell pins 620-2 and 622-2 are wide enough to fully enclose the metal wires 644 and 646 in the direction along the X-axis. The standard cell can, therefore, be used in either its normal orientation or flipped about its Y-axis without requiring metal wires 640 and 642 to be routed off-track to connect to the cell pins 620-2 and 622-2. By avoiding the need for off track routing, the pin-routing scheme of FIG. 6 reduces chip-level congestion and reduces the overall size of an integrated circuit layout by up to three percent compared to the pin-routing scheme of FIG. 5.

Figure 7:
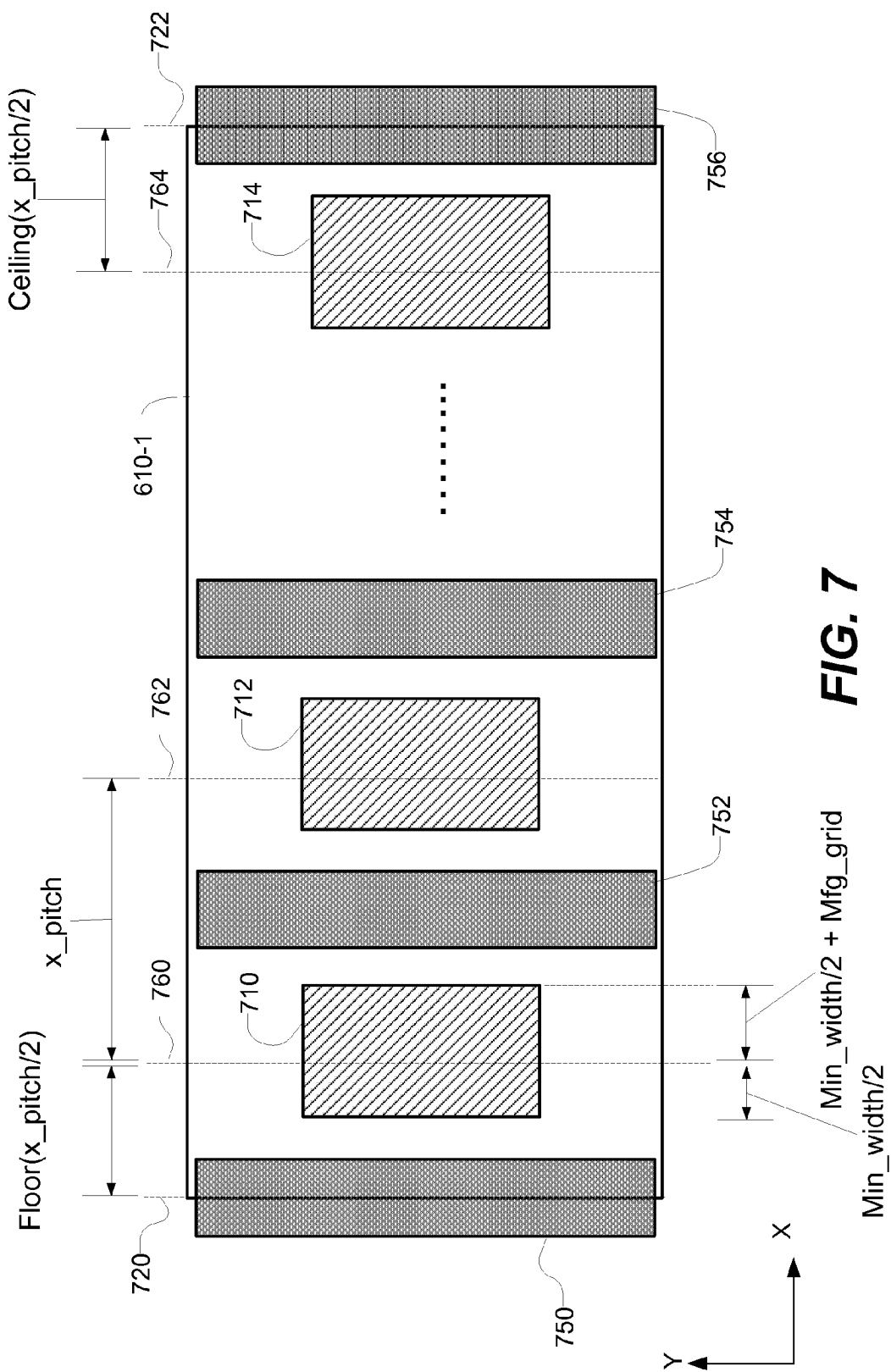
FIG. 7 illustrates one embodiment of an improved pin layout for a standard cell of FIG. 6.

FIG. 7 illustrates one embodiment of an improved pin layout for a standard cell 610-1 of FIG. 6 with cell pins that are at least one manufacturing grid wider than the minimum metal width. As shown, the standard cell 610-1 may have one or more cell pins (e.g., pin 710, 712, and 714). The number of cell pins varies depending on the nature of the logic device represented by the standard cell. For example, an inverter has two cell pins, one for input and one for output. A two input NAND gate has three cell pins, two for input and one for output. Although the cell pins are shown as being side by side, in other embodiments the standard cell may be taller in order to accommodate multiple cell pins along a single vertical routing track. Likewise, there may not be a cell pin located along each routing track in the standard cell.

The position of several routing tracks 760, 762, and 764 that are used by the EDA software 212 to route chip level metal connections on the M1 layer is overlaid onto the cell 610-1 as reference lines for describing the location of the cell pins. The routing tracks are offset from the left edge 720 of the cell according to the formula below, which specifies the offset of the Nth routing track.

$$LOffset(N) = floor(x\_pitch/2) + (N-1)*x\_pitch \quad \text{Equation (1)}$$

where LOffset(N) is the offset of the Nth routing track from a reference line such as the left edge 720 of the cell. X_pitch is the distance between routing tracks measured in manufacturing grid units, and is an odd multiple of the manufacturing grid. N is an integer that is greater than or equal to one. Floor is a function that rounds down to the closest integer. For example, routing track 710 is offset from the left edge of the cell by floor(x_pitch/2). Routing track 762 is offset from the left edge of the cell by floor(x_pitch/2)+x_pitch.

Alternatively, when the right edge 722 of the cell is used as a reference line, the routing tracks are offset from the right edge 722 by this formula:

$$ROffset(N) = ceiling(x\_pitch/2) + (N-1)*x\_pitch \quad \text{Equation (2)}$$

where ROffset(N) is the offset of the Nth routing track from the right edge 722 of the cell. Ceiling is a function that rounds up to the closest integer. For example, the routing track 714 closest to the right edge 722 of the cell is offset from the right side of the cell by ceiling(x_pitch/2). Because the cell 610-1 has a width that is equal to a multiple of x_pitch, either equation (1) or equation (2) can be used to determine the location of the routing tracks with respect to the cell boundaries regardless of the cell boundary used as the reference line.

In one embodiment, the standard cell 610-1 includes a plurality of gates 750, 752, 754 and 756 running in a vertical direction. Gates 750 and 756 are centered on the left and right boundaries of the standard cell 610-1. The gates have a fixed pitch according to the gate pitch rule. In one embodiment, the gate pitch is equal to the x_pitch. In this embodiment, each routing track is situated between two adjacent gates. For example, routing track 760 is located between gate 750 and gate 752. Each routing track is offset from the center of one adjacent gate by floor(x_pitch/2). Each routing track is also offset from the center of the other adjacent gate by ceiling(x_pitch/2). For example, routing track 760 is offset by floor(x_pitch/2) from the center of gate 750 and ceiling(x_pitch/2) from gate 752.

The width of the pins is at least one manufacturing grid wider than the minimum metal width. In other words, the width of each cell pin can be expressed with the following formula:

$$PinWidth \geq Min\_width + Mfg\_grid \quad \text{Equation (3)}$$

where PinWidth is the width of the pin in manufacturing grid units. Mfg_grid is a unit of the manufacturing grid. Min_width is the minimum width of a metal wire routed in a metal layer, as specified by the metal width rule, measured in manufacturing grid units. The cell pins extend at least Min_width/2 to the left of a routing track offset and at least Min_width/2+Mfg_grid to the right of a routing track offset. For example, pin 710 extends by Min_width/2 towards gate 750 and Min_width/2+Mfg_grid towards gate 752. Routing cell pins with this extra width allows the cell pins to be aligned with minimum width wires routed along the vertical routing tracks when the cell is flipped on its Y-axis.

In another embodiment, the routing track offsets are reversed. In other words, the routing tracks may be offset relative to the left edge of the cell by ceiling(x_pitch/2) plus a multiple of x_pitch. In this embodiment, the pins extend at least Min_width/2 to the right of an offset and at least Min_width/2+Mfg_grid to the left of the offset.

Figure 8:
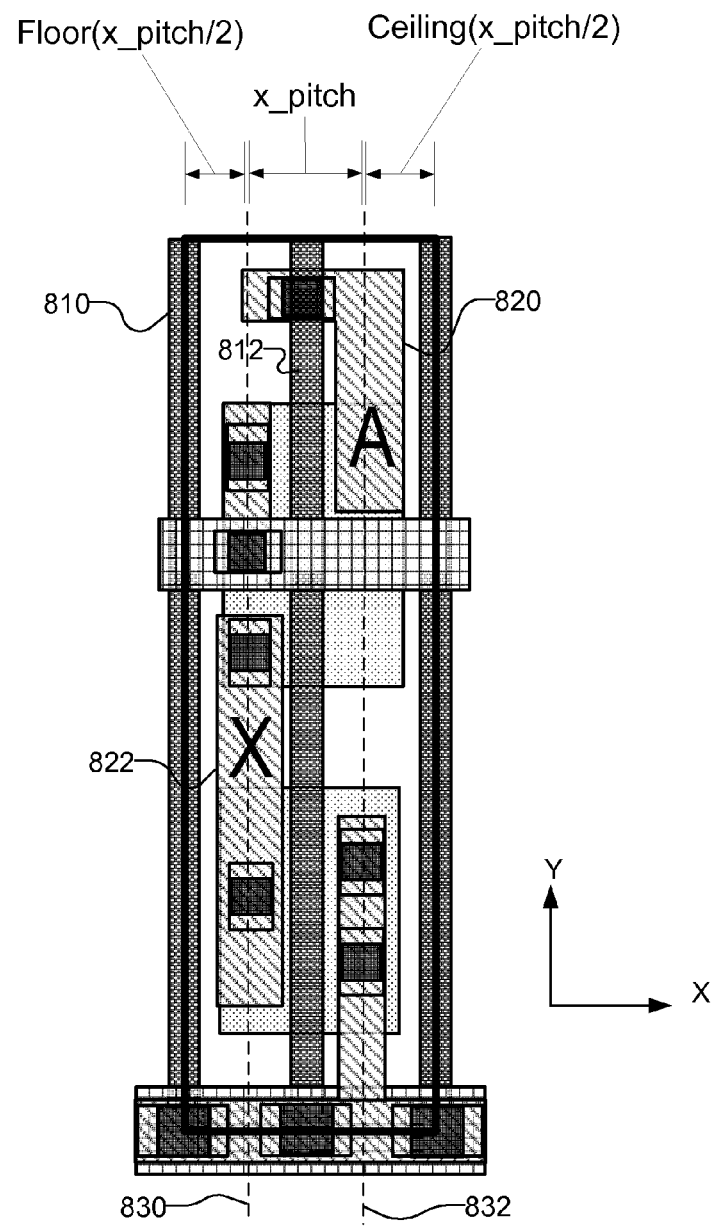
FIG. 8 illustrates one embodiment of a standard cell layout of an inverter with improved pin routing.

FIG. 8 illustrates one embodiment of a standard cell layout of an inverter with improved pin routing. An inverter is one example of a standard cell that can benefit from wider cell pins. As shown, the position of two routing tracks 830 and 832 that are used by the EDA software to route wires on the M1 layer is overlaid onto the cell as reference points. Both routing tracks are offset by approximately half the routing distance from the cell boundaries. Routing track 830 is offset by floor(x_pitch/2) from the left boundary of the cell, and routing track 832 is offset by ceiling(x_pitch/2) from the right boundary of the cell.

The inverter has one input A and one output X. Input signal A is accessible through cell pin 820. Output signal X is accessible through cell pin 822. Both cell pins 820 and 822 are offset from the cell boundaries by approximately half the x_pitch. Cell pins 820 and 822 are also wider than the minimum metal width. The resulting inverter layout can be used as a standard cell in either its normal orientation or flipped about its Y-axis. Regardless of how the standard cell is oriented, the cell pins 820 and 822 will still be properly aligned with minimum metal width wires that are centered on the vertical routing tracks 830 and 832.

The inverter also includes several vertical gates (e.g., 810 and 812). Gate 810 is a dummy gate feature at the cell boundary, and gate 812 forms the P and N devices of the inverter. The gate pitch is equal to the x_pitch, and the cell itself is two x_pitches in width. In other embodiments, the gate pitch may not be fixed, as the process may permit multiple gate spacing values. In such embodiments, the gate pitch is greater or less than the x_pitch.

The disclosed embodiments beneficially allow for the cell pins of standard cells to be aligned with wires extending along routing tracks in either the normal orientation of the cells or when the cells are flipped along their Y-axis. The embodiments are particularly applicable when the pitch between routing tracks is an odd multiple of the manufacturing grid and the routing tracks cannot be located exactly half the pitch from the cell boundary. In such a situation, routing cell pins to be wider than the minimum width wires ensures proper alignment between the cell pins and the chip-level wires. In other embodiments, the principles described herein can also be applied in other dimensions (e.g., along the X-axis) to enable cells to be flipped along the X-axis while maintaining proper alignment with wires on horizontal routing tracks when the horizontal routing pitch is an odd multiple of the manufacturing grid.

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The various operations of example methods described herein, such as those performed by the compiler, may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to improve the clarity of this disclosure. This description should be read to include one or at least one and the singular also includes the plural unless it is obvious that it is meant otherwise.

Upon reading this disclosure, those of skill in the art will appreciate still additional alternative structural and functional designs for a system for improved pin routing through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. An integrated circuit comprising:
   a first metal wire extending along a first routing track that is parallel to an axis, the first metal wire having a first width that is equal to a minimum metal width for metal wires defined by a design rule;
   a second metal wire extending along a second routing track that is parallel to the axis, the second metal wire having a width that is equal to the first width, the first routing track and the second routing track separated by one or more routing pitches, the routing pitch being an odd multiple of units for a manufacturing grid, the manufacturing grid representing a grid to which objects in a layout of the integrated circuit are aligned;
   a first cell instance including a plurality of cell pins, the cell pins including a first cell pin that is connected to the first metal wire, wherein the first cell pin extends in a first direction from the first routing track by at least half the first width and extends in a second direction from the first routing track by more than half the first width; and
   a second cell instance which is a flipped version of the first cell instance relative to the axis, the second cell instance including a second pin corresponding to the first pin and connected to the second metal wire.

2. The integrated circuit of claim 1, wherein the first routing track is offset from a boundary of the cell by a distance corresponding to zero or more routing pitches plus one of: floor of half the routing pitch or ceiling of half the routing pitch.

3. The integrated circuit of claim 1, wherein the second cell pin extends in the first direction from the second routing track by at least half the first width and extends in the second direction from the second routing track by more than half the first width.

4. The integrated circuit of claim 3, wherein the first direction is opposite from the second direction.

5. An integrated circuit comprising:
a first metal wire extending along a first routing track that is parallel to an axis, the first metal wire having a first width;
a second metal wire extending along a second routing track that is parallel to the axis, the second metal wire having a width that is equal to the first width, the first routing track and the second routing track separated by one or more routing pitches, the routing pitch being an odd multiple of units for a manufacturing grid, the manufacturing grid representing a grid to which objects in a layout of the integrated circuit are aligned;
a first cell instance including a plurality of cell pins, the cell pins including a first cell pin that is connected to the first metal wire, the first cell pin extending in a first direction from the first routing track by at least half the first width and extending in a second direction from the first routing track by more than half the first width; and
a second cell instance which is a flipped version of the first cell instance relative to the axis, the second cell instance including a second pin corresponding to the first pin and connected to the second metal wire.

6. The integrated circuit of claim 5, wherein the first routing track is offset from a boundary of the first cell instance by a distance corresponding to zero or more routing pitches plus one of: floor of half the routing pitch or ceiling of half the routing pitch.

7. The integrated circuit of claim 5, wherein the first width corresponds to a minimum width for metal wires defined by a restrictive design rule.

8. The integrated circuit of claim 5, wherein the second cell pin extends in the first direction from the second routing track by at least half the first width and extends in the second direction from the second routing track by more than half the first width.

9. The integrated circuit of claim 5, wherein the first cell instance comprises a plurality of gates that are parallel to the axis, the gates having a pitch that is equal to the routing pitch.

10. The integrated circuit of claim 5, wherein the first metal wire is centered on the first routing track and the second metal wire is centered on the second routing track.

11. The integrated circuit of claim 5, wherein the first metal wire, second metal wire, first cell pin, and second cell pin are in a common metal layer.

12. A computer-implemented method comprising:
receiving a cell library including a plurality of cells; and
generating, by a computer, a layout for an integrated circuit by arranging instances of the cells, the layout comprising:
a first metal wire extending along a first routing track that is parallel to an axis, the first metal wire having a width that is equal to a first width;
a second metal wire extending along a second routing track that is parallel to the axis, the second metal wire having a width that is equal to the first width, the first routing track and the second routing track separated by one or more routing pitches, the routing pitch being an odd multiple of units for a manufacturing grid, the manufacturing grid representing a grid to which objects in the layout of the integrated circuit are aligned;
a first cell instance including a plurality of cell pins, the cell pins including a first cell pin that is connected to the first metal wire, the first cell pin extending in a first direction from the first routing track by at least half the first width and extending in a second direction from the first routing track by more than half the first width; and
a second cell instance which is a flipped version of the first cell instance relative to the axis, the second cell including a second pin corresponding to the first pin and connected to the second metal wire.

13. The method of claim 12, wherein the first routing track is offset from a boundary of the first cell instance by a distance corresponding to zero or more routing pitches plus one of: floor of half the routing pitch or ceiling of half the routing pitch.

14. The method of claim 12, wherein the first width corresponds to a minimum width for metal wires defined by a restrictive design rule.

15. The method of claim 12, wherein the second cell pin extends in the first direction from the second routing track by at least half the first width and extends in the second direction from the second routing track by more than half the first width.

16. A system for generating a layout of an integrated circuit, the system comprising:
a processor; and
a non-transitory computer readable medium storing instructions, the instructions when executed by the processor cause the processor to:
receive a cell library including a plurality of cells; and
generate a layout for an integrated circuit by arranging instances of the cells, the layout comprising:
a first metal wire extending along a first routing track that is parallel to an axis, the first metal wire having a width that is equal to a first width;
a second metal wire extending along a second routing track that is parallel to the axis, the second metal wire having a width that is equal to the first width, the first routing track and the second routing track separated by one or more routing pitches, the routing pitch being an odd multiple of units for a manufacturing grid, the manufacturing grid representing a grid to which objects in the layout of the integrated circuit are aligned;
a first cell instance including a plurality of cell pins, the cell pins including a first cell pin that is connected to the first metal wire, the first cell pin extending in a first direction from the first routing track by at least half the first width and extending in a second direction from the first routing track by more than half the first width; and
a second cell instance which is a flipped version of the first cell instance relative to the axis, the second cell instance including a second pin corresponding to the first pin and connected to the second metal wire.

17. The system of claim 16, wherein the first routing track is offset from a boundary of the first cell instance by a distance corresponding to zero or more routing pitches plus one of: floor of half the routing pitch or ceiling of half the routing pitch.

18. The system of claim 16, wherein the first width corresponds to a minimum width for metal wires defined by a restrictive design rule.

19. The system of claim 16, wherein the second cell pin extends in the first direction from the second routing track by at least half the first width and extends in the second direction from the second routing track by more than half the first width.

20. A non-transitory computer readable medium storing instructions executable by a processor, the instructions when executed cause the processor to:

receive a cell library including a plurality of cells; and generate a layout for an integrated circuit by arranging instances of the cells, the layout comprising:

a first metal wire extending along a first routing track that is parallel to an axis, the first metal wire having a width that is equal to a first width;

a second metal wire extending along a second routing track that is parallel to the axis, the second metal wire having a width that is equal to the first width, the first routing track and the second routing track separated by one or more routing pitches the routing pitch being an odd multiple of units for a manufacturing grid, the manufacturing grid representing a grid to which objects in the layout of the integrated circuit are aligned;

a first cell instance including a plurality of cell pins, the cell pins including a first cell pin that is connected to the first metal wire, the first cell pin extending in a first direction from the first routing track by at least half the first width and extending in a second direction from the first routing track by more than half the first width; and a second cell instance which is a flipped version of the first cell instance relative to the axis, the second cell including a second pin corresponding to the first pin and connected to the second metal wire.

21. A non-transitory computer readable medium storing data representing a layout of an integrated circuit, the layout of the integrated circuit comprising:

a first metal wire extending along a first routing track that is parallel to an axis, the first metal wire having a width that is equal to a first width;

a second metal wire extending along a second routing track that is parallel to the axis, the second metal wire having a width that is equal to the first width, the first routing track and the second routing track separated by one or more routing pitches, the routing pitch being an odd multiple of units for a manufacturing grid, the manufacturing grid representing a grid to which objects in the layout of the integrated circuit are aligned;

a first cell instance including a plurality of cell pins, the cell pins including a first cell pin that is connected to the first metal wire, the first cell pin extending in a first direction from the first routing track by at least half the first width and extending in a second direction from the first routing track by more than half the first width; and a second cell instance which is a flipped version of the first cell instance relative to the axis, the second cell including a second pin corresponding to the first pin and connected to the second metal wire.

22. The integrated circuit of claim 1, wherein the first direction is opposite from the second direction.

23. The computer readable medium of claim 20, wherein the first routing track is offset from a boundary of the first cell instance by a distance corresponding to zero or more routing pitches plus one of: floor of half the routing pitch or ceiling of half the routing pitch.

24. The computer readable medium of claim 21, wherein the first routing track is offset from a boundary of the first cell instance by a distance corresponding to zero or more routing pitches plus one of: floor of half the routing pitch or ceiling of half the routing pitch.

\* \* \* \* \*